United States Patent
Yoo et al.

(10) Patent No.: US 9,577,214 B2
(45) Date of Patent: Feb. 21, 2017

(54) ADHESIVE FILM AND METHOD OF ENCAPSULATING ORGANIC ELECTRONIC DEVICE

(71) Applicant: LG CHEM, LTD., Seoul (KR)

(72) Inventors: Hyun Jee Yoo, Daejeon (KR); Yoon Gyung Cho, Daejeon (KR); Seung Min Lee, Daejeon (KR); Suk Ky Chang, Daejeon (KR); Jung Sup Shim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 125 days.

(21) Appl. No.: 14/098,347

(22) Filed: Dec. 5, 2013

(65) Prior Publication Data

US 2014/0091296 A1    Apr. 3, 2014

(30) Foreign Application Priority Data

Nov. 14, 2011  (KR) .................. 10-2011-0118476
Nov. 14, 2011  (KR) .................. 10-2011-0118478
(Continued)

(51) Int. Cl.
  *C09J 7/02*    (2006.01)
  *C09J 7/00*    (2006.01)
  (Continued)

(52) U.S. Cl.
  CPC ............ *H01L 51/5246* (2013.01); *C09J 7/00* (2013.01); *C09J 7/02* (2013.01); *C09J 7/0203* (2013.01);
  (Continued)

(58) Field of Classification Search
  None
  See application file for complete search history.

(56) References Cited

U.S. PATENT DOCUMENTS 3,963,850 A  *  6/1976  Doss .................. B32B 27/04
                                              442/381
5,240,548 A  *  8/1993  Aramaki et al. .......... 156/556
(Continued)

FOREIGN PATENT DOCUMENTS

CN        101260223 A    9/2008
CN        101370889 A    2/2009
(Continued)

*Primary Examiner* — Frank D Ducheneaux
(74) *Attorney, Agent, or Firm* — Dentons US LLP

(57) ABSTRACT

Provided are an adhesive film, an encapsulated product of an organic electronic device using the same, and a method of encapsulating an organic electronic device. Particularly, the adhesive film encapsulating the organic electronic device to cover an entire surface of the organic electronic device includes an adhesive layer including a curable resin and a moisture adsorbent. The adhesive layer has a viscosity in a temperature range of 30 to 130° C. of $10^1$ to $10^6$ Pa·s and a viscosity at room temperature of $10^6$ Pa·s or more in an uncured state, and when the adhesive layer has a multilayered structure, a difference in melting viscosity between layers is less than 30 Pa·s. In addition, the method of encapsulating an organic electronic device using the adhesive film is provided.

23 Claims, 2 Drawing Sheets

(30) Foreign Application Priority Data

Nov. 14, 2012 (KR) ........................ 10-2012-0128892
Nov. 14, 2012 (KR) ........................ 10-2012-0129018

(51) Int. Cl.
  *C09J 11/00* (2006.01)
  *C08K 3/22* (2006.01)
  *C08K 3/24* (2006.01)
  *C08K 3/32* (2006.01)
  *H01L 51/52* (2006.01)
  *C08K 3/00* (2006.01)

(52) U.S. Cl.
  CPC ............. *C09J 11/00* (2013.01); *H01L 51/524* (2013.01); *H01L 51/5253* (2013.01); *C08K 3/0033* (2013.01); *C08K 3/22* (2013.01); *C08K 3/24* (2013.01); *C08K 3/32* (2013.01); *C08K 2003/2227* (2013.01); *C09J 2201/134* (2013.01); *C09J 2201/36* (2013.01); *C09J 2203/326* (2013.01); *C09J 2205/102* (2013.01); *C09J 2463/00* (2013.01); *H01L 51/5259* (2013.01); *Y10T 428/24942* (2015.01); *Y10T 428/24959* (2015.01)

(56) References Cited

U.S. PATENT DOCUMENTS

| | | | | |
|---|---|---|---|---|
| 5,338,588 A | * | 8/1994 | Billiu | ............................ 428/36.3 |
| 5,827,908 A | * | 10/1998 | Arai et al. | .................... 523/212 |
| 6,231,997 B1 | * | 5/2001 | Arai et al. | .................... 428/620 |
| 6,284,817 B1 | * | 9/2001 | Cross | ........................ C08K 3/08 523/220 |
| 2002/0193474 A1 | * | 12/2002 | Daily | ..................... C09J 133/06 524/109 |
| 2003/0143423 A1 | * | 7/2003 | McCormick et al. | ........ 428/690 |
| 2004/0191566 A1 | | 9/2004 | Kikuchi et al. | |
| 2004/0241393 A1 | * | 12/2004 | Thakkar et al. | ............... 428/156 |
| 2008/0213943 A1 | | 9/2008 | Takamoto et al. | |
| 2009/0026934 A1 | | 1/2009 | Fujita et al. | |
| 2009/0128338 A1 | * | 5/2009 | Arai et al. | .................. 340/572.7 |
| 2010/0040894 A1 | | 2/2010 | Rosenau et al. | |
| 2010/0096175 A1 | * | 4/2010 | Ishimatsu et al. | ............ 174/260 |
| 2011/0266578 A1 | | 11/2011 | Kanisawa et al. | |
| 2012/0207991 A1 | * | 8/2012 | Arai et al. | ..................... 428/216 |

FOREIGN PATENT DOCUMENTS

| | | |
|---|---|---|
| EP | 2637229 A2 | 9/2013 |
| JP | 2004-265776 | 9/2004 |
| JP | 2009-049253 | 3/2009 |
| JP | 4597910 | 10/2010 |
| JP | 2011-032436 | 2/2011 |
| KR | 10-20070072400 | 7/2007 |
| KR | 10-20100034726 | 4/2010 |
| KR | 10-20110029769 | 3/2011 |
| TW | 200914569 | 4/2009 |
| WO | 2011016408 A1 | 2/2011 |
| WO | 2011/027815 | 3/2011 |

* cited by examiner

ADHESIVE FILM AND METHOD OF ENCAPSULATING ORGANIC ELECTRONIC DEVICE

This application is a Continuation Bypass of International Application No. PCT/KR2012/009619, filed Nov. 14, 2012, and claims priority to and the benefit of Korean Patent Application Nos. 10-2011-0118476, filed Nov. 14, 2011, 10-2011-0118478, filed Nov. 14, 2011, 10-2012-0129018, filed Nov. 14, 2012, and 10-2012-0128892, filed Nov. 14, 2012 the disclosures of which are incorporated herein by reference in their entirety.

FIELD

The present invention relates to an adhesive film and a method of encapsulating an organic electronic device (OED) using the same.

BACKGROUND

An organic electronic device refers to a device including an organic material layer generating the exchange of charges using holes and electrons, and may include a photovoltaic device, a rectifier, a transmitter and an organic light-emitting diode (OLED).

A representative organic electronic device, which is an organic light-emitting diode (OLED), has less power consumption and a higher response speed, and forms a thinner display device or light than a conventional light source. In addition, the OLED has excellent space utilization, and thus is expected to be applied in various fields including all kinds of portable devices, monitors, notebook computers and TVs.

To extend compatibility and use of the OLED, a major problem to be solved in the related art is durability. Organic materials and metal electrodes included in the OLED are very easily oxidized by external factors such as moisture, and a product including the OLED is very sensitive to environmental factors. Therefore, various methods to effectively prevent penetration of oxygen or moisture into the organic electronic device such as an OLED from an external environment have been suggested.

Moreover, a more fundamental problem than durability is a decrease in failure occurring due to degradation of laminating properties during assembly of a panel. During the assembly of the panel, it is very important that adhesive strength between panels be maintained in a constant level, and the panels be laminated without bubbles and maintain a uniform thickness.

Therefore, exemplary embodiments of the present invention are to provide an encapsulant capable of corresponding to manufacturing a larger and thinner organic electronic device, providing structural advantages by encapsulating an organic electronic device in a simpler process, and giving reliability from an operation of assembling a panel.

SUMMARY

The present invention is directed to providing an adhesive film, an encapsulated product of an organic electronic device using the same, and a method of encapsulating an organic electronic device.

In one aspect, the present invention provides an adhesive film encapsulating an organic electronic device, including an adhesive film including a curable resin and a water adsorbent. The adhesive layer has a viscosity of $10^1$ to $10^6$ Pa·s at a temperature range from 30 to 130° C. in an uncured state, and a viscosity of $10^6$ Pa·s or more at room temperature when the adhesive layer is in an uncured state.

In another aspect, the present invention provides an encapsulated product of an organic electronic device, including a substrate, and an organic electronic device formed on the substrate, and the adhesive film encapsulating the organic electronic device to cover an entire surface thereof.

In still other aspect, the present invention provides a method of encapsulating an organic electronic device, including applying the adhesive film to a substrate on which an organic electronic device is formed to cover an entire surface of the organic electronic device with an adhesive layer of the adhesive film; and curing the adhesive layer.

EFFECT

As an adhesive film according to exemplary embodiments of the present invention controls viscosities at room temperature and an increasing temperature of an adhesive layer in a B-stage state in a specific range, excellent room temperature handability can be obtained, an exact assembly margin cannot be ensured in the assembly of a panel, an entire surface of the panel can be maintained at a uniform thickness, an un-laminated part cannot be made during lamination (increasing temperature lamination), and failure rate can be reduced since the lamination does not occur without bubbles. Moreover, as a film-type adhesive, not a liquid-phase adhesive, is used, lifespan and durability of the organic electronic device can be enhanced. In addition, the adhesive film provides a structural advantage capable of supporting and fixing upper and lower substrates of the organic electronic device, thereby simplifying a method of encapsulating an organic electronic device and cutting costs.

Figure 1:
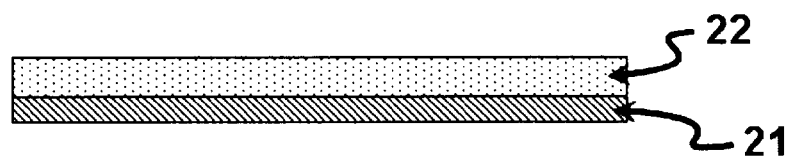
FIGS. 1 to 3 are cross-sectional views of adhesive films according to an exemplary embodiment of the present invention.

DESCRIPTION OF REFERENCE NUMERALS 21,23: base or release film
22: adhesive layer
31: substrate
32: adhesive film
33: organic electronic device
34: second substrate (cover substrate)

DETAILED DESCRIPTION OF EXEMPLARY EMBODIMENTS

An adhesive film according to an exemplary embodiment of the present invention is used to encapsulate or capsulate an organic electronic device. The term "organic electronic device (OED)" used herein refers to a product or device having a structure including an organic material layer generating the exchange of charges between a pair of facing electrodes using holes and electrons. The organic electronic device may include a photovoltaic device, a rectifier, a transmitter and an OLED, but the present invention is not limited thereto. In one embodiment, the organic electronic device may be an OLED.

An adhesive film according to exemplary embodiments of the present invention includes an adhesive layer, which is increased in processability by controlling viscosity at room temperature or an increasing temperature of the adhesive layer in an uncured (B-stage) state, and has a maximized moisture blocking effect by including a moisture adsorbent.

In one embodiment, the adhesive layer may be formed using a curable hot-melt-type adhesive composition including at least one curable resin. The term "curable hot-melt-type adhesive composition" used herein may refer to an adhesive maintaining a solid or semi-solid state at room temperature, being melted by applying heat to exhibit pressure-sensitive adhesive properties, and tightly fixing a target material after the adhesive is cured.

An adhesive film according to exemplary embodiments of the present invention may have a viscosity of $10^6$ Pa·s or more, or $10^7$ Pa·s or more at room temperature in an uncured state. The term "room temperature" refers to a temperature in a natural environment, not increased or decreased. Room temperature may be approximately 15° C. to 35° C., specifically, approximately 20° C. to 25° C., and more specifically, approximately 25° C. The viscosity may be measured using an advanced rheometric expansion system (ARES). When the viscosity of the curable hot-melt-type adhesive is controlled within the above range, a burr or crack is not generated during punching, thereby easily handling the film, and the film has good work processability during the encapsulation of the organic electronic device, thereby encapsulating a planar plate to a uniform thickness in a planar type. In addition, as problems of contraction and generation of a volatile gas occurring when the resin is cured are considerably reduced, it (the film) can prevent physical or chemical damage to the organic electronic device. As long as the adhesive is maintained in a solid or semi-solid state, the upper limit of the viscosity is not particularly limited, and for example, in consideration of processability, the viscosity may be controlled in a range of approximately $10^9$ Pa·s or less.

The adhesive film according to exemplary embodiments of the present invention may have a viscosity of $10^1$ to $10^6$ Pa·s or $10^2$ to $10^5$ Pa·s during lamination, that is, in an increasing temperature range before curing, in an uncured state. The term "uncured state" used herein refers to an intermediate state in which a curing reaction of a curable resin is rarely performed, and is also called "B-stage." When the adhesive layer of the adhesive film is laminated in an uncured state, the viscosity in a range of increasing temperature of approximately 30 to 130° C., which is an increasing temperature range before curing, may be controlled within the above range, thereby reducing failure and enhancing reliability during the assembly of a panel.

Generally, to assemble a panel, thermal lamination is performed in a vacuum state by applying heat of 50° C. to 100° C. However, when, in the lamination operation, bubbles are captured or an un-laminated part is generated, a failure may be generated. In addition, when an adhesive is leaked during the thermal lamination due to a lower viscosity of the adhesive film than a certain level, an exact assembly margin may not be provided, and a uniform thickness may not be maintained in a large-scale product. Contrarily, when the viscosity is higher than a certain required level, it is possible to generate an un-laminated part in the adhesive film. However, unlike the conventional art, the adhesive film according to exemplary embodiments of the present invention may prevent the generation or capture of bubbles, and attach a panel without step difference by providing a tack characteristic according to an increase in temperature of the adhesive film during the attachment of the panel by controlling the viscosity at increasing temperature within a specific range in an uncured state. In addition, in a curing operation after attachment, flowability of the adhesive film may be increased and wettability may also be increased, thereby realizing better adhesive characteristics and removing remaining fine bubbles.

In the assembly of a panel, the adhesive is flown or leaked at a lamination temperature. When the adhesive film is laminated to an adherent at a temperature range from 50° C. to 100° C. in an uncured state, the adhesive of the adhesive layer may be leaked 1 mm or less from an original location. That is, the adhesive present in any part of the adhesive layer in an uncured state may not be flown or leaked more than 1 mm from an original location during lamination. In such an uncured state, as the flowability of the adhesive is controlled by controlling the viscosity in an increasing temperature range of the adhesive layer, reliability may be provided when the adhesive is applied to the process.

The adhesive layer may be formed in a mono layer, or a multilayered structure including at least two sub-adhesive layers. When the adhesive film has a multilayered structure including at least two sub-adhesive layers, a difference in viscosity at a temperature range from 30° C. to 130° C. in the uncured state between the sub-adhesive layers may be less than 30 Pa·s, 25 Pa·s or less or 20 Pa·s or less. In the sub-adhesive layers, the viscosity of an upper or lower layer may be high or low, and the difference in viscosity between the sub-adhesive layers may be preferably 0 Pa·s.

In addition, when the difference in viscosity at 30° C. to 130° C. in the uncured state between the sub-adhesive layers is less than 30 Pa·s, a difference in flowability or leakage between the sub-adhesive layers in the lamination may be 0 µm to 300 µm. Here, in a general lamination operation, the adhesive film may be thermally laminated on an adherent at a temperature range from 50° C. to 100° C. and a variable pressure range, but the present invention is not limited thereto. As an embodiment, the lamination may be performed at a pressure of 0.05 MPa to 5 MPa.

The viscosity of each sub-adhesive layer may be controlled by changing components included in the adhesive layer, or changing a content ratio of the components, a content of an additive, the kind or diameter of a moisture adsorbent or filler, and a condition for forming an adhesive film.

When the adhesive layer includes at least two sub-adhesive layers, at least one sub-adhesive layer may include a curable resin and a moisture adherent. For example, when the adhesive layer is formed with two layers, a moisture adsorbent may be included in an upper adhesive layer, not in a lower adhesive layer. In this case, when the adhesive layer will be used to assemble a panel, a moisture adsorbent may not be included in a part directly attached to an organic electronic device, and thus damage to a device due to a moisture adsorbent may be prevented.

In the sub-adhesive layers constituting the adhesive layer, a curable resin, the kind and content of a moisture adsorbent or another additive, and the kind and content of a filler may be the same as or different from each other.

The curable resin may have a water vapor transmission rate (WVTR) in a cured state of 50 g/m²·day or less, 30 g/m²·day or less, 20 g/m²·day or less, or 15 g/m²·day or less.

The term "cured state of a curable resin" refers to a state converted into a state in which the curable resin has constant components of the moisture adsorbent and filler and serves as a structural adhesive when the curable resin is cured or crosslinked by being used alone or a reaction with other components such as a curing agent and then applied to an encapsulant, through the radiation of heat or light. The WVTR may be measured in a thickness direction of the cured product at 38° C. and under a relative humidity of 100% after the curable resin is cured and the cured product is formed in a film having a thickness of 80 µm. In addition, the WVTR may be measured according to ASTM F1249.

As the WVTR of the curable resin is controlled within the above range, the penetration of water, vapor or oxygen into an encapsulated product of an organic electronic device may be effectively inhibited, and an effect of inducing a moisture reactive adsorbent may be exhibited.

As the WVTR in the cured state of the resin is decreased, the encapsulated structure has better performance. The lower limit of the WVTR is not particularly limited, but may be preferably 0 g/m²·day.

The adhesive film may have a glass transition temperature (Tg) in the cured state of 90° C. or more.

A specific kind of curable resin capable of being used in exemplary embodiments of the present invention is not particularly limited, and for example, may include various heat-curable, photocurable and dual curable resins, which are known in the related art. The term "heat-curable resin" refers to a resin capable of being cured through application of suitable heat or an aging process, the term "photocurable resin" refers to a resin capable of being cured by the radiation of an electromagnetic wave, and the term "dual curable resin" refers to a resin simultaneously having characteristics of a heat-curable resin and a photocurable resin and capable of being cured by radiation of an electromagnetic wave and application of heat. In addition, in the category of the electromagnetic waves, particle beams such as microwaves, IR rays, UV rays, X rays and gamma rays, and electron beams such as alpha-particle beams, proton beams, neutron beams and electron beams may be included. As an embodiment of the photocurable resin, a cationic photocurable resin may be used. The cationic photocurable resin refers to a resin capable of being cured by cationic polymerization or a cationic curing reaction induced by the radiation of an electromagnetic wave.

A specific kind of curable resin capable of being used in exemplary embodiments of the present invention is not particularly limited, as long as the curable resin has the above-described characteristics. For example, a resin capable of being cured to exhibit adhesive characteristics may include a resin including at least one heat-curable functional group of a glycidyl group, an isocyanate group, a hydroxyl group, a carboxyl group or an amide group, or at least one functional group capable of being cured by the radiation of an electromagnetic wave, selected from an epoxide group, a cyclic ether group, a sulfide group, an acetal group and a lactone group. In addition, a specific kind of resin may include an acryl resin, a polyether resin, an isocyanate resin or an epoxy resin, but the present invention is not limited thereto.

As the curable resin, an aromatic or aliphatic, or linear or branched epoxy resin may be used. In one exemplary embodiment of the present invention, an epoxy resin containing at least two functional groups and an epoxy equivalent of 180 to 1,000 g/eq may be used. When the epoxy resin having the above epoxy equivalent is used, the cured product may have effectively-maintained characteristics such as adhesive performance and a glass transition temperature. Such an epoxy resin may be one or a mixture of at least two of a cresol novolac epoxy resin, a bisphenol A-type epoxy resin, a bisphenol A-type novolac epoxy resin, a phenol novolac epoxy resin, a 4-functional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin and a dicyclopentadiene-modified phenol-type epoxy resin.

In specific exemplary embodiments of the present invention, an epoxy resin including a ring structure in a molecular structure may be used, and for example, an epoxy resin including an aromatic group (e.g., a phenyl group) may be used. When the epoxy resin includes an aromatic group, a cured product may have excellent thermal and chemical stabilites and low moisture absorption, thereby enhancing reliability of the encapsulated product of an organic electronic device. The aromatic-group containing epoxy resin may be, but is not limited to, one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenolmethane-type epoxy resin and an alkyl-modified triphenolmethane epoxy resin.

The adhesive layer (in the case of a mono layer, an adhesive layer, or in the case of a multilayer, a part or all of at least one sub-adhesive layer) includes a moisture adsorbent in addition to the curable resin. The term "moisture adsorbent" may be used as a meaning including components capable of adsorbing or removing water or vapor entering from an external environment, through a chemical reaction with moisture, and also called a moisture-reactive adsorbent.

The moisture adsorbent adsorbs water or vapor by a chemical reaction with vapor, water or oxygen entering the adhesive layer. A specific kind of moisture adsorbent capable of being used in exemplary embodiments of the present invention is not particularly limited, and for example, may be one or a mixture of at least two of metal powder such as alumina, a metal oxide, an organic metal oxide, a metal salt and phosphorous pentoxide ($P_2O_5$).

A specific embodiment of the metal oxide may be lithium oxide ($Li_2O$), sodium oxide ($Na_2O$), barium oxide (BaO), calcium oxide (CaO) or magnesium oxide (MgO), the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

In exemplary embodiments of the present invention, the metal oxides may be mixed with the composition in a state in which the moisture adsorbent is suitably processed. For example, depending on the kind of organic electronic device to which the adhesive film is to be applied, the adhesive layer may be a thin film having a thickness of 30 µm or less, and in this case, it may be necessary to perform a grinding process to the moisture adsorbent. To grind the moisture adsorbent, a process such as a 3-roll mill, bead mill or ball mill may be used. In addition, when the adhesive film is applied to a top-emission type organic electronic device, transmissivity of the adhesive layer is very important, and thus it is necessary to decrease the size of the moisture adsorbent. Therefore, to be used in such a use, the moisture adsorbent is necessarily subjected to a grinding process.

The adhesive layer may include the moisture adsorbent at 5 to 100 or 5 to 90 parts by weight relative to 100 parts by weight of the curable resin. As the content of the moisture adsorbent is controlled within the above range, a moisture blocking property may be maximized within a range causing no damage to the organic electronic device.

Unless particularly defined otherwise, the unit "parts by weight" used herein refers to a weight ratio between components.

In the adhesive layer of the adhesive film, the moisture adsorbent may be uniformly dispersed.

The adhesive layer of the adhesive film according to exemplary embodiments of the present invention may include a filler, for example, an inorganic filler. The filler may extend a traveling path of water or vapor penetrated into an encapsulated structure to inhibit the penetration of water or vapor, and maximize a blocking property to water and vapor due to a matrix structure of a curable resin and through interaction with the moisture adsorbent. A specific kind of filler capable of being used in exemplary embodiments of the present invention may be, but is not limited to, one or a mixture of at least two of clay, talc, silica, barium sulfate, aluminum hydroxide, calcium carbonate, magnesium carbonate, zeolite, zirconia, titania or montmorillonite.

In addition, to increase binding efficiency between the filler and the curable resin, a product whose surface is treated with an organic material may be used as the filler, or a coupling agent may be further added to the filler.

The adhesive composition may include 1 to 50 or 1 to 30 parts by weight of the filler relative to 100 parts by weight of the curable resin. As the content of the filler is controlled to 1 part by weight or more, a cured product having excellent water or vapor blocking properties and mechanical properties may be provided. In addition, as the content of the filler is controlled to 50 parts by weight or less, a cured product capable of being formed in a film type, and exhibiting adhesive characteristics even when being formed in a thin film, may be provided.

The adhesive layer of the adhesive film according to exemplary embodiments of the present invention may further include an initiator capable of initiating a curing reaction of a curing agent or resin capable of forming a matrix such as a crosslinking structure by a reaction with a curable resin, for example, a cationic photopolymerization initiator.

A specific kind of curing agent is not particularly limited, and may be suitably selected according to the kind of functional group included in a curable resin or resin used. The curing agent may be a potential curing agent such as an imidazole-based compound. For example, when the epoxy resin is used as a curable resin, a general curing agent for an epoxy resin known in the related art may be used as the curing agent, which may be, but is not limited to, one or a mixture of at least two of all kinds of amine-based compounds, imidazole-based compounds, phenol-based compounds, phosphorous-based compounds and acid anhydride-based compounds.

The adhesive layer may include the curing agent at 1 to 20 or 1 to 10 parts by weight relative to 100 parts by weight of the curable resin. However, the content is only an example of the present invention. That is, the content of the curing agent may be changed according to the kind and content of the curing agent or functional group, and a matrix structure or crosslinking density to be realized.

In addition, the kind of initiator, for example, the cationic photopolymerization initiator is not particularly limited, and thus a known cationic photopolymerization initiator such as an aromatic diazonium salt, an aromatic iodine aluminum salt, an aromatic sulfonium salt or an iron-arene complex, and preferably, an aromatic sulfonium salt, may be used. However, the present invention is not limited thereto.

For example, the initiator may be included at 0.01 to 10 or 0.1 to 3 parts by weight relative to 100 parts by weight of the curable resin. When the content of the cationic photopolymerization initiator is excessively low, curing may not be sufficiently performed, and when the content of the cationic photopolymerization initiator is excessively high, the content of the ionic material is increased after curing, thereby degrading durability of an adhesive, or because of the initiator having a characteristic of forming a conjugate acid, the optical durability of the film may be degraded. Depending on a base, corrosion may occur, and in consideration of this, a suitable content range may be selected.

The adhesive layer may further include a high molecular weight resin. The high molecular weight resin may serve to improve moldability when a composition for forming an adhesive layer is molded in a film or sheet. In addition, the high molecular weight resin may serve as a high-temperature viscosity controller for controlling flowability during a hot-melting process.

The kind of high molecular weight resin capable of being used in exemplary embodiments of the present invention is not particularly limited as long as the resin has compatibility with another component such as the curable resin. A specific kind of high molecular weight resin capable of being used may be, but is not limited to, a resin having a weight average molecular weight of 20,000 or more, which is one or a mixture of at least two of a phenoxy resin, an acrylate resin, a high molecular weight epoxy resin, a ultra-high molecular weight epoxy resin, a rubber containing a high polarity functional group, and a reactive rubber containing a high polarity functional group, but the present invention is not limited thereto.

When a high molecular weight resin is included in the adhesive layer, the content is controlled according to a desired physical property, not particularly limited. For example, the high molecular weight resin may be included at approximately 10 to 200, 20 to 150, or 20 to 100 parts by weight or less relative to 100 parts by weight of the curable resin. As the content of a binder resin is controlled to 10 to 200 parts by weight or less, the compatibility with each component of the resin composition may be effectively maintained, and the binder resin may serve as an adhesive. When the content of the high molecular weight resin, that is, the binder resin, is excessively low, the resin may be leaked outside due to a low viscosity in a lamination process, thereby increasing room temperature pressure-sensitive adhesive strength and having a difficulty in controlling releasability. In addition, when the content of the high molecular weight resin is excessively high, failure in lamination property may be generated. Therefore, as the viscosity of each layer is controlled by controlling the content of the high molecular weight resin to reduce a difference in viscosity, optimized processibility and physical properties may be ensured.

The adhesive layer of the adhesive film may further include additives such as an additional filler to improve durability of the cured product, a coupling agent for enhancing mechanical strength and adhesive strength, a plasticizer, a UV stabilizer and an antioxidant without an influence on the effects of the present invention.

A structure of the adhesive film according to exemplary embodiments of the present invention is not particularly limited if the film includes the adhesive layer. For example, the adhesive film may have a structure including a base or release film (hereinafter, referred to as a "first film"); and adhesive layer formed on the base or release film. The adhesive film may further include another base or release film (hereinafter, referred to as a "second film"), which is formed on the adhesive layer.

Figure 2:
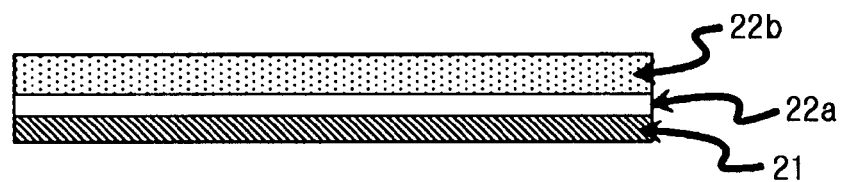
Figure 3:
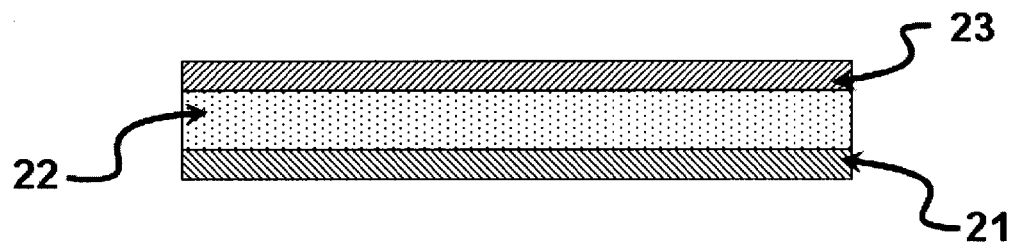

FIGS. 1 to 3 are cross-sectional views of an adhesive film according to an exemplary of the present invention. As shown in FIG. 1, an adhesive film according to exemplary embodiments of the present invention may include an adhesive layer 22 formed on a base or release film 21.

In another aspect of the present invention, as shown in FIG. 2, the adhesive film may include an adhesive layer having a multilayered structure, for example, including a first sub-adhesive layer 22a excluding a moisture adsorbent, and a second adhesive layer 22b including a moisture adsorbent, which are sequentially formed on the base or release film 21.

In still another aspect of the present invention, as shown in FIG. 3, the adhesive film may further include a base or release film 23 formed on the adhesive layer 22. In one embodiment, to realize a flexible display, a gas barrier layer may be disposed on one surface of the base film. However, the adhesive film shown in the drawings is merely an aspect of the present invention. The adhesive film according to exemplary embodiments of the present invention may include, for example, a composition of the present invention without a support base, and may have a type in which a monolayered adhesive layer maintaining a solid or semi-solid phase at room temperature, and in some cases, a type of a double-sided adhesive film.

A specific kind of first film capable of being used in exemplary embodiments of the present invention is not particularly limited. As the first film, for example, a general polymer film in the related art may be used. For example, as the base or release film, a polyethyleneterephthalate film, a polytetrafluorethylene film, a polyethylene film, a polypropylene film, a polybutene film, a polybutadiene film, a vinylchloride copolymer film, a polyurethane film, ethylene-a vinylacetate film, an ethylene-propylene copolymer film, an ethylene-acrylic acid ethyl copolymer film, an ethylene-acrylic acid methyl copolymer film or a polyimide film, may be used. In addition, suitable releasing treatment may be performed to one or both surfaces of the base or release film. As a releasing agent used in releasing treatment of the base film, an alkyd-based, silicon-based, fluorine-based, unsaturated ester-based, polyolefin-based or wax-based releasing agent, and preferably, for thermal resistance, an alkyd-based, silicon-based or fluorine-based releasing agent may be used, but the present invention is not limited thereto.

In addition, the kind of second film (hereinafter, also referred to as a "cover film") capable of being used in exemplary embodiments of the present invention is neither particularly limited. For example, the second film may be the same as or different from the first film within the range exemplified as the first film. In addition, the second film may also be subjected to suitable releasing treatment.

A thickness of the base or release film (first film) is not particularly limited, and may be suitably selected according to its use. For example, the first film may have a thickness of 10 μm to 500 μm or 20 μm to 200 μm. When the thickness of the film is less than 10 μm, transformation of the base film may easily occur in the forming process, and when the thickness of the film is more than 500 μm, economic feasibility may be decreased.

A thickness of the second film may neither be particularly limited. For example, the thickness of the second film may be set the same as that of the first film. Alternatively, in consideration of processibility, the thickness of the second film may be set relatively smaller than that of the first film.

A thickness of the adhesive layer included in the adhesive film according to exemplary embodiments of the present invention is not particularly limited, and may be suitably selected according to the following condition in consideration of the use of the film. The adhesive layer may be, for example, 5 μm to 200 μm or 5 μm to 100 μm.

In exemplary embodiments of the present invention, a method of forming the adhesive film is not particularly limited. For example, the adhesive film may be formed by a method including coating a coating solution including a composition for an adhesive layer on a base or release film (first operation), and drying the coating solution coated in the first operation (second operation). The method of forming the adhesive film may further include further compressing a base or release film on the coating solution dried in the second operation (third operation).

The first operation is to prepare a coating solution by dissolving or dispersing the composition for the adhesive layer in a suitable solvent. The content of the curable resin included in the coating solution used in the operation may be suitably controlled according to desired moisture blocking properties and film moldability.

The kind of the solvent used in the preparation of the coating solution is not particularly limited. However, since drying time of the solvent is excessively long, or the solvent is necessarily dried at high temperature, problems may arise in terms of workability or durability of the adhesive film. For this reason, a solvent having a volatilization temperature of 100° C. or less may be used. Moreover, in consideration of film moldability, a small amount of the solvent having a volatilization temperature within the above range or more may be mixed. The solvent may be, but is not limited to, one or a mixture of at least two of methylethylketone (MEK), acetone, toluene, dimethylformamide (DMF), methylcellosolve (MCS), tetrahydrofuran (THF) or N-methylpyrrollidone (NMP).

In the first operation, a method of coating the coating solution on a base or release film is not particularly limited, and a known method such as knife coating, roll coating, spray coating, gravure coating, curtain coating, comma coating or lip coating, may be used without limitation.

The second operation is to form an adhesive layer by drying the coating solution coated in the first operation. That is, in the second operation, an adhesive layer may be formed by drying and removing a solvent by heating the coating solution coated to the film. Here, a drying condition is not particularly limited, and the drying may be performed at 70° C. to 200° C. for 1 minutes to 10 minutes.

In the forming method, after the second operation, a third operation of compressing an additional base or release film on the adhesive layer formed on the film, may be further performed. In the third operation, the additional release or base film (cover film or second film) may be compressed on the dried adhesive layer coated on the film by a roll lamination process.

Figure 4:
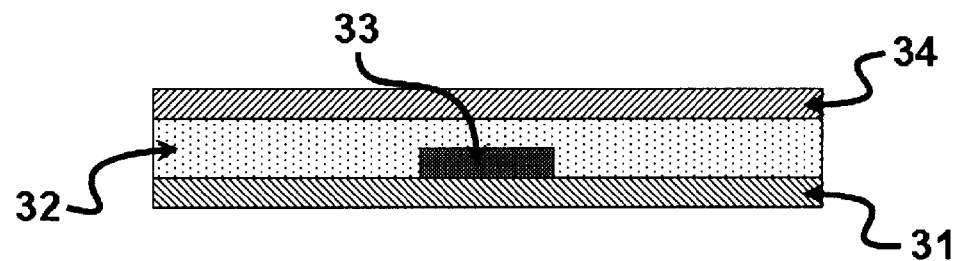
FIG. 4 is a cross-sectional view of an encapsulated product of an organic electronic device according to an exemplary embodiment of the present invention.

FIG. 4 is a cross-sectional view of an encapsulated product of an organic electronic device according to an exemplary embodiment of the present invention. In another exemplary embodiment of the present invention, an encapsulated product of an organic electronic device includes a substrate 31; an organic electronic device 33 formed on the substrate 31, and the above-described adhesive film 32 encapsulating the organic electronic device 33 to cover an entire surface of the organic electronic device 33. Here, the covering of the entire surface of the organic electronic device 33 refers to attachment of the adhesive film 32 to an entire area (all surfaces, for example, upper and side surfaces, not in contact with the substrate) of the organic electronic device 33 without a gap.

The encapsulated product of the organic electronic device may further include a second substrate (cover substrate) 34 on the adhesive film 32, which serves to attach the substrate 31 with the second substrate 34.

The organic electronic device 33 may be, for example, an organic light-emitting diode (OLED).

The encapsulated product of the organic electronic device may include a protective layer (not shown) protecting the organic electronic device 33 between the adhesive film 32 and the organic electronic device 33.

The encapsulated product of the organic electronic device according to exemplary embodiments of the present invention has advantages of a simple process and a decrease in production cost. The encapsulated product of the organic electronic device can also be used regardless of a method of designing the organic electronic device, and provide excellent mechanical durability to the organic electronic device.

In still another exemplary embodiment of the present invention, a method of encapsulating an organic electronic device includes applying an adhesive layer of the above-described adhesive film to a substrate on which an organic electronic device is formed to cover an entire surface of the organic electronic device, and curing the adhesive layer.

The application of the adhesive film to the organic electronic device may be performed by hot-roll lamination, hot press or vacuum compression of the adhesive film, but the present invention is not particularly limited.

The application of the adhesive film to the organic electronic device may be performed at 50° C. to 100° C., and the curing operation may be performed by heating in a range of 70° C. to 110° C., or radiating a UV ray.

In addition, the method may further include attaching the adhesive film to an additional encapsulation material such as glass or metal to face each other.

The method of encapsulating an organic electronic device includes forming a transparent electrode on a substrate such as glass or a polymer film by a method such as vacuum deposition or sputtering, and forming an organic material layer on the transparent electrode. The organic material layer may include a hole injection layer, a hole transport layer, an emitting layer, an electron injection layer and/or an electron transport layer. Subsequently, a second electrode is further formed on the organic material layer. Afterward, the above-described adhesive film is applied to a top surface of the organic electronic device on the substrate to cover an entire surface of the organic electronic device. Here, a method of applying the adhesive film is not particularly limited, but may be heating or compressing a cover substrate (e.g., glass or a polymer film) to which the above-described adhesive layer of the adhesive film is previously transfer-printed to a top surface of the organic electronic device formed on the substrate. In this operation, for example, when the adhesive film is transfer-printed on the cover substrate, the above-described adhesive film may be transfer-printed on the cover substrate using a vacuum press or vacuum laminator by applying heat after a base or release film formed on the film is peeled off. In this operation, when a curing reaction of the adhesive film is performed in a certain range or more, cohesive strength or adhesive strength of the adhesive film may be decreased, thereby controlling a process temperature and a process time to approximately 100° C. and approximately 5 minutes, respectively. Similarly, even when the cover substrate on which the adhesive film is transfer-printed is heat-compressed to the organic electronic device, a vacuum press or vacuum laminator may be used. A temperature condition for this operation may be set as described above, and a process time may be within 10 minutes.

In addition, an additional curing process to the adhesive film to which the organic electronic device is compressed may be performed, and such a curing process (main curing) may be performed, for example, in a heating chamber or UV chamber. A curing condition in the main curing may be suitably selected in consideration of stability of the organic electronic device.

However, the above-described forming process is merely an example for encapsulating the organic electronic device, and thus a sequence of or condition for the process may be freely changed. For example, the sequence of the transfer-printing and compressing processes may be changed in such a manner that the above-described adhesive film is transfer-printed to the organic electronic device on the substrate, followed by compressing the cover substrate. In addition, after the protective layer is formed on the organic electronic device, the adhesive film is applied and then cured without the cover substrate.

Hereinafter, the present invention will be described in further detail with reference to Examples according to the present invention and Comparative Examples not according to the present invention, but the scope of the present invention is not limited to the following Examples.

Example 1

1. Preparation of Solution for First Sub-Adhesive Layer 50 g of an epoxy resin (YD-128, Kukdo Chemical Co., Ltd.) and 50 g of a phenoxy resin (YP-50, Tohto Kasei Co., Ltd.) were put into a reactor, and diluted with 100 g of methylethylketone. 1 g of an imidazole curing agent (2MA.OK, Shikoku Chemicals Co., Ltd.) was added thereto, and the resulting solution was homogenized.

2. Preparation of Solution for Second Sub-Adhesive Layer

A moisture adsorbent solution was prepared by adding 10 g of MgO at a concentration of 20 weight % as a moisture adsorbent to methylethylketone, and milled for 24 hours by ball-milling. In addition, separately, 60 g of an epoxy resin (YD-128, Kukdo Chemical Co., Ltd.) and 40 g of a phenoxy resin (YP-50, Tohto Kasei Co., Ltd.) were put into a reactor, and diluted with 100 g of methylethylketone. Afterward, 1 g of an imidazole curing agent (2MA.OK, Shikoku Chemicals Co., Ltd.) was added thereto, and the resulting solution was homogenized. The previously prepared moisture adsorbent solution was put into the homogenized solution, and stirred at high speed for 1 hour, thereby preparing a solution for a second sub-adhesive layer.

3. Formation of Adhesive Film

A first sub-adhesive layer having a thickness of 15 μm was formed by applying the above-prepared solution for a first sub-adhesive layer to a release surface of release PET using a comma coater, and drying the resulting surface in a drier at 130° C. for 3 minutes.

A second sub-adhesive layer having a thickness of 30 μm was formed by applying the above-prepared solution for a second sub-adhesive layer to a release surface of release PET using a comma coater, and drying the resulting surface in a drier at 130° C. for 3 minutes.

The first and second sub-adhesive layers are assembled, thereby forming a multilayered adhesive film.

Example 2

An adhesive film having a monolayered structure having a thickness of 45 μm was formed only using the solution for a second sub-adhesive layer in Example 1.

Example 3

A multilayered adhesive film was formed as described in Example 1, except that the solutions for first and second sub-adhesive layers were prepared as to be described below.
1. Preparation of Solution for First Sub-Adhesive Layer
25 g of an epoxy resin (YD-128, Kukdo Chemical Co., Ltd.), 35 g of epoxy resin (YD-014, Kukdo Chemical Co., Ltd.) and 40 g of a phenoxy resin (YP-50, Tohto Kasei Co., Ltd.) were put into a reactor, and diluted with 100 g of methylethylketone. 1 g of an imidazole curing agent (2MA.OK, Shikoku Chemicals Co., Ltd.) was added thereto, and the resulting solution was homogenized.
2. Preparation of Solution for Second Sub-Adhesive layer
A moisture adsorbent solution was prepared by adding 10 g of MgO at a concentration of 20 weight % as a moisture adsorbent to methylethylketone, and milled for 24 hours by ball-milling. In addition, separately, 55 g of an epoxy resin (YD-128, Kukdo Chemical Co., Ltd.) and 45 g of a phenoxy resin (YP-50, Tohto Kasei Co., Ltd.) were put into a reactor, and diluted with 100 g of methylethylketone. Afterward, 1 g of an imidazole curing agent (2MA.OK, Shikoku Chemicals Co., Ltd.) was added thereto, and the resulting solution was homogenized. The previously prepared moisture adsorbent solution was put into the homogenized solution, and stirred at high speed for 1 hour, thereby preparing a solution for a second sub-adhesive layer.

Example 4

A multilayered adhesive film was formed as described in Example 1, except that the solutions for first and second sub-adhesive layers were prepared as to be described below.
1. Preparation of Solution for First Sub-Adhesive Layer
50 g of an epoxy resin (YD-128, Kukdo Chemical Co., Ltd.) and 50 g of a phenoxy resin (YP-50, Tohto Kasei Co., Ltd.) were put into a reactor, and diluted with 100 g of methylethylketone. 1 g of an imidazole curing agent (2MA.OK, Shikoku Chemicals Co., Ltd.) was added thereto, and the resulting solution was homogenized. Subsequently, 3 g of nano silica (Aerosil R972, Evonik Degussa) was uniformly dispersed.
2. Preparation of Solution for Second Sub-Adhesive layer
A moisture adsorbent solution was prepared by adding 10 g of MgO at a concentration of 20 weight % as a moisture adsorbent to methylethylketone, and milled for 24 hours by ball-milling. In addition, separately, 50 g of an epoxy resin (YD-128, Kukdo Chemical Co., Ltd.) and 50 g of a phenoxy resin (YP-50, Tohto Kasei Co., Ltd.) were put into a reactor, and diluted with 100 g of methylethylketone. Afterward, 1 g of an imidazole curing agent (2MA.OK, Shikoku Chemicals Co., Ltd.) was added thereto, and the resulting solution was homogenized. The previously prepared moisture adsorbent solution was put into the homogenized solution, and stirred at high speed for 1 hour, thereby preparing a solution for a second sub-adhesive layer.

Comparative Example 1

A multilayered adhesive film was formed as described in Example 1, except that the content of the phenoxy resin (YP-50, Tohto Kasei Co., Ltd.) used in the solution for a first sub-adhesive layer in Example 1 was changed to 30 g.

Comparative Example 2

An adhesive film having a monolayered structure having a thickness of 45 μm was formed as described in Example 2, except that the epoxy and phenoxy resins used in the solution for a second sub-adhesive layer in Example 2 were substituted with 20 g of an epoxy resin (YD-128, Kukdo Chemical Co., Ltd.) and 80 g of a phenoxy resin (YP-50, Tohto Kasei Co., Ltd.).

Comparative Example 3

An adhesive film having a monolayered structure having a thickness of 45 μm was formed as described in Example 2, except that the epoxy and phenoxy resins used in the solution for a second sub-adhesive layer in Example 2 were substituted with 80 g of an epoxy resin (YD-128, Kukdo Chemical Co., Ltd.) and 20 g of a phenoxy resin (YP-50, Tohto Kasei Co., Ltd.).

Comparative Example 4

A multilayered adhesive film was formed as described in Example 1, except that the solutions for first and second sub-adhesive layers were prepared as to be described below.
1. Preparation of Solution for First Sub-Adhesive Layer
50 g of an epoxy resin (YD-128, Kukdo Chemical Co., Ltd.) and 30 g of a phenoxy resin (YP-50, Tohto Kasei Co., Ltd.) were put into a reactor, and diluted with 100 g of methylethylketone. 1 g of an imidazole curing agent (2MA.OK, Shikoku Chemicals Co., Ltd.) was added thereto, and the resulting solution was homogenized.
2. Preparation of Solution for Second Sub-Adhesive layer
A moisture adsorbent solution was prepared by adding 10 g of MgO at a concentration of 20 weight % as a moisture adsorbent to methylethylketone, and milled for 24 hours by ball-milling. In addition, separately, 60 g of an epoxy resin (YD-128, Kukdo Chemical Co., Ltd.) and 40 g of a phenoxy resin (YP-50, Tohto Kasei Co., Ltd.) were put into a reactor, and diluted with 100 g of methylethylketone. Afterward, 1 g of an imidazole curing agent (2MA.OK, Shikoku Chemicals Co., Ltd.) was added thereto, and the resulting solution was homogenized. The previously prepared moisture adsorbent solution was put into the homogenized solution, and stirred at high speed for 1 hour, thereby preparing a solution for a second sub-adhesive layer.

Comparative Example 5

A multilayered adhesive film was formed as described in Example 1, except that the content of MgO was changed to 70 g in the preparation of a moisture adsorbent solution added to the solution for a second sub-adhesive layer in Example 1.

Experimental Example 1

Measurement of Viscosity

Viscosities according to a temperature of the adhesive layers of the adhesive films in Examples 1 to 4 and Comparative Examples 1 to 5 were measured using an ARES, and the viscosities at room temperature and 80° C. are shown in Table 1.

TABLE 1

| | Viscosity at Room Temperature (Pa · s, 25° C.) | Viscosity at Increasing Temperature (Pa · s, 80° C.) |
|---|---|---|
| Example 1 | $3.8 \times 10^6$ | 2367 |
| Example 2 | $4.2 \times 10^6$ | 2385 |
| Example 3 | $6.9 \times 10^6$ | 3250 |
| Example 4 | $1.1 \times 10^7$ | 6790 |
| Comparative Example 1 | $1.2 \times 10^6$ | 1825 |
| Comparative Example 2 | $1.9 \times 10^8$ | $1.2 \times 10^6$ |
| Comparative Example 3 | $7.8 \times 10^4$ | 890 |
| Comparative Example 4 | $9.8 \times 10^5$ | 1439 |
| Comparative Example 5 | $8.8 \times 10^6$ | 5932 |

Experimental Example 2

Measurement of Difference in Viscosity Between Layers

Viscosities of two sub-adhesive layers of the adhesive layer of the adhesive film in each of Examples 1, 3 and 4 and Comparative Examples 1, 4 and 5 were measured using an ARES, and viscosities at 80° C. and a difference in viscosity (between the layers) are shown in Table 2.

TABLE 2

| | Viscosity of 1st Sub-Adhesive Layer (Pa · s, 80° C.) | Viscosity of 2nd Sub-Adhesive Layer (Pa · s, 80° C.) | Difference in Viscosity between Layers (Pa · s, 80° C.) |
|---|---|---|---|
| Example 1 | 2365 | 2371 | 6 |
| Example 3 | 2386 | 2381 | 5 |
| Example 4 | 3265 | 3248 | 17 |
| Comparative Example 1 | 1642 | 2371 | 729 |
| Comparative Example 4 | 1642 | 890 | 752 |
| Comparative Example 5 | 2365 | 4009 | 1644 |

Experimental Example 3

Measurement of Leaking Degree in Lamination

A degree of leaking the adhesive layer of the adhesive film from an early end of the adhesive film of each of Examples 1 to 4 and Comparative Examples 1 to 5 was measured using a microscope at a lamination temperature of 80° C., and the results are shown in Table 3.

TABLE 3

| | Release Degree (μm) | | Difference in Release Degree \|A − B\| |
|---|---|---|---|
| | 1st Sub-Adhesive Layer (A) | 2nd Sub-Adhesive Layer (B) | |
| Example 1 | 510 | 500 | 10 |
| Example 2 | — | 485 | — |
| Example 3 | 480 | 480 | 0 |
| Example 4 | 320 | 320 | 0 |
| Comparative Example 1 | 840 | 530 | 310 |
| Comparative Example 2 | — | 30 | — |
| Comparative Example 3 | — | 1500 | — |
| Comparative Example 4 | 850 | 1480 | 630 |
| Comparative Example 5 | 480 | 40 | 440 |

Experimental Example 4

Confirmation of Moisture Blocking Property

A calcium test was executed to investigate moisture blocking properties of the adhesive film in each of Examples 1 to 4 and Comparative Examples 1 to 5. Particularly, 9 spots of calcium (Ca) were deposited to a size of 5 mm×5 mm and a thickness of 100 nm on a glass substrate having a size of 100 mm×100 mm, a cover glass to which the adhesive film of each of Examples 1 to 4 and Comparative Examples 1 to 5 is transfer-printed was heat-compressed to each calcium-deposited spot at 80° C. for 1 minute using a vacuum press. Afterward, the resulting product was cured in a high-temperature drier at 100° C. for 3 hours, and an encapsulated calcium specimen was cut into a size of 11 mm×11 mm. The obtained specimens were left in an environment including a temperature of 85° C. and an R.H. of 85% in a constant temperature and constant humidity chamber, and a point at which calcium starts turning transparent by an oxidation reaction due to penetration of moisture was measured. The results are shown in Table 4.

TABLE 4

| | Time to Start Transparency(h) |
|---|---|
| Example 1 | 210 |
| Example 2 | 210 |
| Example 3 | 210 |
| Example 4 | 220 |
| Comparative Example 1 | 190 |
| Comparative Example 2 | Not measured due to lamination failure |
| Comparative Example 3 | 160 |
| Comparative Example 4 | 100 |
| Comparative Example 5 | Not measured due to failure of aggravation of leakage |

Experimental Example 5

Measurement of Bubbling Degree

A degree of remaining bubbles in lamination was observed using a microscope when a 3-inch organic light-emitting panel was formed using the adhesive film in each of Examples 1 to 4 and Comparative Examples 1 to 5, and the results are shown in Table 5.

TABLE 5

| | Degree of Remaining Bubbles |
|---|---|
| Example 1 | ⊚ |
| Example 2 | ○ |
| Example 3 | ⊚ |
| Example 5 | ○ |
| Comparative Example 1 | ○ |
| Comparative Example 2 | X |
| Comparative Example 3 | X |
| Comparative Example 4 | X |
| Comparative Example 5 | X |

Figure 5:
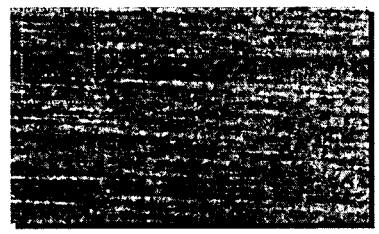
FIGS. 5 to 7 are optical microscopic images observing degrees of remaining bubbles after lamination when organic light-emitting panels are formed using adhesive films according to Example 1, and Comparative Examples 1 and 2.
Figure 6:
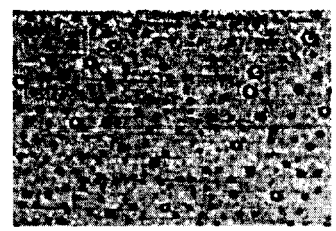
Figure 7:

*⊚: no bubbles, ○: a small amount of bubbles having a diameter of 100 μm or less, and X: presence of bubbles having 1 mm or more In addition, in the formation of an organic light-emitting panel using the adhesive film in each of Example 1 and Comparative Examples 1 and 2, an optical microscopic image observing a degree of remaining bubbles after lamination is shown in FIGS. 5 to 7. Referring to FIG. 5, it can be confirmed that the adhesive film was laminated without bubbles. However, it was confirmed that a large amount of bubbles were captured, and thus a failure was generated in Comparative Example 4, and a lamination failure was generated in Comparative Example 2.

As seen from the above, in the adhesive films in Examples 1 to 4 according to exemplary embodiments of the present invention, a difference between viscosities at room temperature and increasing temperature and viscosities between layers in a multilayered structure was controlled in a specific range in an uncured state, thereby reducing the occurrence of failures and effectively encapsulating the organic electronic device from moisture when an encapsulated product of an organic electronic device was manufactured. However, it can be confirmed that the organic electronic device was not effectively encapsulated when viscosity was not properly controlled as shown in Comparative Example(s).

What is claimed is:

1. An adhesive film encapsulating an organic electronic device, comprising:
    an adhesive layer comprising a curable resin and a moisture adsorbent,
    wherein the adhesive layer has a viscosity of $10^1$ to $10^6$ Pa·s at any one temperature point in the range of 30 to 130° C., and a viscosity of $10^6$ Pa·s or more at any one room temperature point in the range of 15 to 35° C. when the adhesive layer is in an uncured state,
    wherein the adhesive layer is composed of at least two sub-adhesive layers, and a difference in viscosity between the sub-adhesive layers at any one temperature point in the range of 30 to 130° C. in an uncured state is less than 30 Pa·s, and
    wherein at least one sub-adhesive layer comprises the moisture adsorbent, at least one sub-adhesive layer does not comprise the moisture adsorbent, and the sub-adhesive layer which does not comprise the moisture adsorbent encapsulates an entire surface of the organic electronic device.

2. The film of claim 1, wherein a degree of leaking an adhesive of the adhesive layer is 1 mm or less from an original location when the adhesive film is laminated to an adherent at a temperature range from 50 to 100° C. in an uncured state.

3. The film of claim 1, wherein a difference in degree of leaking of an adhesive of each sub-adhesive layer is 0 to 300 μm when the adhesive film is laminated to an adherent at any one temperature point in the range from 50 to 100° C. in an uncured state.

4. The film of claim 1, wherein the curable resin has a water and vapor transmission rate in a cured state of 20 g/m²·day or less.

5. The film of claim 1, wherein the curable resin is a heat-curable or photocurable resin.

6. The film of claim 1, wherein the curable resin comprises at least one curable functional group selected from a glycidyl group, an isocyanate group, a hydroxyl group, a carboxyl group, an amide group, an epoxide group, a cyclic ether group, a sulfide group, an acetal group and a lactone group.

7. The film of claim 1, wherein the curable resin is an epoxy resin comprising an aromatic group in a molecular structure.

8. The film of claim 1, wherein the moisture adsorbent is alumina, metal oxide, metal salt or phosphorous pentoxide.

9. The film of claim 1, wherein the moisture adsorbent is at least one selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

10. The film of claim 1, wherein the adhesive layer comprises 5 to 100 parts by weight of the moisture adsorbent relative to 100 parts by weight of the curable resin.

11. The film of claim 1, wherein the adhesive layer further comprises a filler.

12. The film of claim 11, wherein the filler comprises at least one selected from the group consisting of clay, talc, silica, barium sulfate, aluminum hydroxide, calcium carbonate, magnesium carbonate, zeolite, zirconia, titania or montmorillonite.

13. The film of claim 11, wherein the adhesive layer comprises 1 to 50 parts by weight of the filler relative to 100 parts by weight of the curable resin.

14. The film of claim 1, wherein the adhesive layer further comprises a curing agent.

15. The film of claim 14, wherein the curing agent is an amine-based compound, an imidazole-based compound, a phenol-based compound, a phosphorous-based compound or an acid anhydride-based compound.

16. The film of claim 14, wherein the adhesive layer comprises 1 to 10 parts by weight of the curing agent relative to 100 parts by weight of the curable resin.

17. The film of claim 1, wherein the adhesive layer further comprises a high molecular weight resin.

18. An encapsulated product of an organic electronic device, comprising:
    a substrate;
    an organic electronic device formed on the substrate; and
    an adhesive film according to claim 1 encapsulating the organic electronic device to cover an entire surface of the organic electronic device.

19. The encapsulated product of claim 18, further comprising:
    a second substrate on the adhesive film,
    wherein the adhesive film adheres the substrate to the second substrate.

20. A method of encapsulating an organic electronic device, comprising:

applying the adhesive film according to claim 1 to a substrate on which an organic electronic device is formed to cover an entire surface of the organic electronic device with the adhesive layer of the adhesive film; and curing the adhesive layer.

21. The method of claim 20, wherein the application of the adhesive film to the organic electronic device is performed by hot-roll lamination, hot press or vacuum compression of the adhesive film.

22. The method of claim 20, wherein the application of the adhesive film to the organic electronic device is performed at 50 to 100° C.

23. The method of claim 20, wherein the curing is performed by heating at 70 to 110° C., or radiating UV rays.

* * * * *